(12) United States Patent  
Yamamoto et al.

(10) Patent No.: US 11,043,620 B2  
(45) Date of Patent: Jun. 22, 2021

(54) LIGHT EMITTING DEVICE

(71) Applicant: NICHIA CORPORATION, Anan (JP)

(72) Inventors: Atsushi Yamamoto, Komatsushima (JP); Keiko Ono, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/731,310

(22) Filed: Dec. 31, 2019

(65) Prior Publication Data

US 2020/0135993 A1 Apr. 30, 2020

Related U.S. Application Data

(63) Continuation of application No. 15/850,210, filed on Dec. 21, 2017.

(30) Foreign Application Priority Data

Dec. 26, 2016 (JP) .............................. JP2016-251464

(51) Int. Cl.
*H01L 33/58* (2010.01)
*H01L 25/075* (2006.01)
(Continued)

(52) U.S. Cl.
CPC ............ *H01L 33/58* (2013.01); *F21V 7/0083* (2013.01); *G02F 1/133603* (2013.01);
(Continued)

(58) Field of Classification Search
CPC ..... H01L 33/50; H01L 33/505; H01L 33/486; H01L 33/647; F21K 9/68; G02F 1/133605
See application file for complete search history.

(56) References Cited

U.S. PATENT DOCUMENTS

2006/0203146 A1 9/2006 Bang
2007/0138494 A1 6/2007 Pugh et al.
(Continued)

FOREIGN PATENT DOCUMENTS

EP 2474857 A2 7/2012
JP S59-127253 U1 8/1984
(Continued)

OTHER PUBLICATIONS

Non Final Office Action of the U.S. Appl. No. 15/850,210, dated Jul. 23, 2018.
(Continued)

*Primary Examiner* — Alia Sabur
(74) *Attorney, Agent, or Firm* — Global IP Counselors, LLP

(57) ABSTRACT

A light emitting device includes a mounting board, light sources, a light diffuser, a wavelength conversion layer, and scatter reflection portions. Each of the light sources has an upper face on which a light reflecting layer is disposed. The light diffuser is arranged above the plurality of light sources. The wavelength conversion layer is located at least between the light sources and the light diffuser. The wavelength conversion layer is configured to absorb at least a portion of light from the light sources and to emit light having a wavelength which is different from a wavelength of the light from the light sources. The scatter reflection portions are arranged on a surface of the wavelength conversion layer that is closer to the light diffuser. Each of the scatter reflection portions is arranged above at least a portion of the upper face of a corresponding one of the light sources.

20 Claims, 7 Drawing Sheets

(51) Int. Cl.
*F21V 7/00* (2006.01)
*G02F 1/13357* (2006.01)
*H01L 33/60* (2010.01)
*H01L 33/46* (2010.01)
*H01L 33/50* (2010.01)
*H01L 33/62* (2010.01)

(52) U.S. Cl.
CPC .. *G02F 1/133605* (2013.01); *G02F 1/133606* (2013.01); *G02F 1/133611* (2013.01); *H01L 25/0753* (2013.01); *H01L 33/46* (2013.01); *H01L 33/504* (2013.01); *H01L 33/60* (2013.01); *H01L 33/62* (2013.01); *H01L 33/505* (2013.01); *H01L 33/507* (2013.01); *H01L 2933/0091* (2013.01)

(56) References Cited

U.S. PATENT DOCUMENTS

| | | | |
|---|---|---|---|
| 2007/0284600 A1 | 12/2007 | Shchekin et al. | |
| 2008/0007939 A1 | 1/2008 | Lee et al. | |
| 2008/0290351 A1* | 11/2008 | Ajiki | H01L 25/0753 257/88 |
| 2009/0086508 A1 | 4/2009 | Bierhuizen | |
| 2010/0065876 A1* | 3/2010 | Kang | H01L 33/486 257/98 |
| 2010/0102743 A1 | 4/2010 | Hou et al. | |
| 2010/0265694 A1* | 10/2010 | Kim | G02B 6/0021 362/97.1 |
| 2011/0031520 A1 | 2/2011 | Mizuno | |
| 2011/0051411 A1 | 3/2011 | Kim et al. | |
| 2011/0063850 A1 | 3/2011 | Oide et al. | |
| 2011/0249424 A1 | 10/2011 | Joo et al. | |
| 2011/0260195 A1* | 10/2011 | Chakraborty | H01L 33/56 257/98 |
| 2012/0305973 A1* | 12/2012 | Chosa | H01L 33/44 257/98 |
| 2014/0327024 A1 | 11/2014 | Ishihara et al. | |
| 2014/0376219 A1 | 12/2014 | Ono et al. | |
| 2015/0021642 A1 | 1/2015 | Nakabayashi | |
| 2015/0129902 A1* | 5/2015 | Iino | H01L 33/505 257/88 |
| 2015/0226400 A1* | 8/2015 | Wada | H01L 33/60 362/97.1 |
| 2016/0054486 A1 | 2/2016 | Isojima et al. | |
| 2016/0320001 A1* | 11/2016 | Soer | F21V 9/08 |
| 2019/0027646 A1 | 1/2019 | Lerman et al. | |

FOREIGN PATENT DOCUMENTS

| | | |
|---|---|---|
| JP | S63-024858 U1 | 2/1988 |
| JP | 2001036151 A | 2/2001 |
| JP | 2001257381 A | 9/2001 |
| JP | 2007-053352 A | 3/2007 |
| JP | 2008-004948 A | 1/2008 |
| JP | 2008021650 A | 1/2008 |
| JP | 2008270144 A | 11/2008 |
| JP | 2008-294224 A | 12/2008 |
| JP | 2011-040494 A | 2/2011 |
| JP | 2011-090949 A | 5/2011 |
| JP | 2012-059988 A | 3/2012 |
| JP | 2012-064476 A | 3/2012 |
| JP | 2012212509 A | 11/2012 |
| JP | 2013-503431 A | 1/2013 |
| JP | 2013-025945 A | 2/2013 |
| JP | 2013-536592 A | 9/2013 |
| JP | 2015-095488 A | 5/2015 |
| JP | 2016-046262 A | 4/2016 |
| JP | 2016-062804 A | 4/2016 |
| TW | 200928517 A | 7/2009 |
| WO | 2007-011068 A1 | 1/2007 |
| WO | 2011-096171 A1 | 8/2011 |

OTHER PUBLICATIONS

Final Office Action of the U.S. Appl. No. 15/850,210, dated Jan. 22, 2019.

Non Final Office Action of the U.S. Appl. No. 15/850,210, dated May 15, 2019.

Notice of Allowance of the U.S. Appl. No. 15/850,210, dated Oct. 2, 2019.

Non Final Office Action of the U.S. Appl. No. 15/850,210, dated Feb. 28, 2020.

Final Office Action in the related U.S. Appl. No. 15/850,210, dated Aug. 13, 2020.

Non-Final Office Action in the related U.S. Appl. No. 15/850,210, dated Nov. 23, 2020.

* cited by examiner

US 11,043,620 B2

LIGHT EMITTING DEVICE

CROSS-REFERENCE TO RELATED APPLICATION

This application is a continuation application of U.S. patent application Ser. No. 15/850,210, filed on Dec. 21, 2017. This application claims priority to Japanese Patent Application No. 2016-251464, filed on Dec. 26, 2016. The entire disclosures of U.S. patent application Ser. No. 15/850,210 and Japanese Patent Application No. 2016-251464 are hereby incorporated herein by reference.

BACKGROUND

The present disclosure relates to a light emitting device.

As backlights for use in liquid crystal display devices and the like, direct-type light emitting devices are known (see, for example, Japanese Patent Publication No. 2016-046262). Generally speaking, a direct-type light emitting device is structured such that a plurality of semiconductor light-emitting elements are arranged in a two-dimensional array, and is likely to achieve a higher contrast ratio than does an edge-type light emitting device in which light is incident from a lateral face of a light guide plate.

SUMMARY

In the field of display devices, there exists not only a need for an improved contrast ratio, but also a need for reduced thickness.

A light emitting device according to the present disclosure comprises: a mounting board; a plurality of light sources arranged on the mounting board, each of the light sources having an upper face on which a light reflecting layer is disposed; a light diffuser arranged above the light sources; a wavelength conversion layer; and a plurality of scatter reflection portions. The wavelength conversion layer is located at least between the light sources and the light diffuser. The wavelength conversion layer is configured to absorb at least a portion of light from the light sources and to emit light having a wavelength which is different from a wavelength of the light from the light sources. The scatter reflection portions are arranged on a surface of the wavelength conversion layer that is closer to the light diffuser. Each of the scatter reflection portions is arranged above at least a portion of the upper face of a corresponding one of the light sources.

According to an embodiment of the present disclosure, a direct-type light emitting device with reduced thickness is provided.

DETAILED DESCRIPTION

Figure 1:
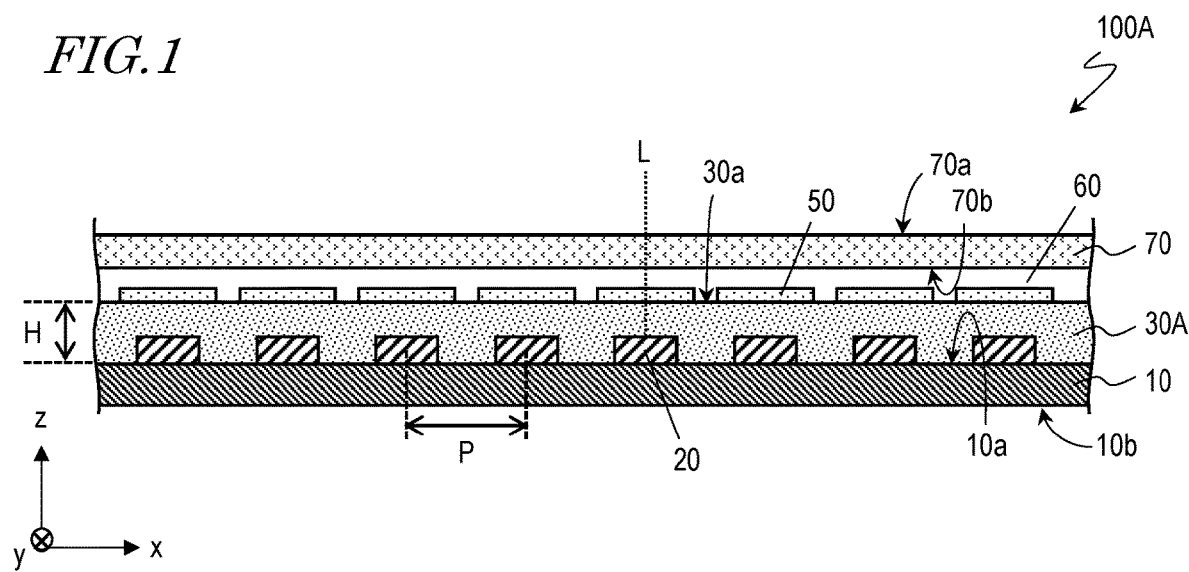
FIG. 1 is a schematic cross-sectional view showing a light emitting device according to a first embodiment of the present disclosure.

Hereinafter, with reference to the drawings, embodiments of light emitting devices according to the present disclosure will be described in detail. The following embodiments are only exemplary, and the light emitting devices according to the present disclosure are not limited to the following embodiments. In the following description, terms indicating specific directions or positions (e.g., "upper", "above", "over", "lower", "below", "under", "right", and "left", or any other terms of which these are parts) may be used. These terms are merely being used to indicate relative directions or positions in the drawing under attention, in a manner that provides easy understanding. So long as the relative directions or positions as indicated by terms such as "above", "below", etc., in the drawing under attention are conserved, any drawing employed outside the present disclosure, actually manufactured products, or the like may not adhere to the same exact positioning as that indicated in the drawing under attention. Note that the sizes, relative positioning, etc. of any component elements shown in a drawing may be exaggerated for ease of understanding, and thus may not strictly reflect their sizes, relative positioning, etc., in an actual light emitting device. In order to avoid excessive complexity of the drawings, certain elements may be omitted from illustration in schematic cross-sectional views and the like.

First Embodiment

FIG. 1 schematically shows a cross section of a light emitting device 100A according to a first embodiment of the present disclosure. For reference, FIG. 1 shows arrows indicating the x direction, the y direction, and the z direction which are orthogonal to one another. These arrows may also appear in any other drawing attached to the present disclosure. The light emitting device 100A shown in FIG. 1 includes a mounting board 10, a plurality of light sources 20, a wavelength conversion layer 30A, scatter reflection portions 50, and a light diffuser 70. The light emitting device 100A may be used as a backlight for a liquid crystal display device or the like, for example. Hereinafter, the respective component elements will be described in detail.

Mounting Board 10

The mounting board 10 has an upper face 10a and a lower face 10b. The plurality of light sources 20 are located on the upper face 10a of the mounting board 10.

As the material of the mounting board 10, ceramics or resins may be used, for example. From the standpoints of cost reduction and ease of molding, a resin may be chosen as the material of the mounting board 10. Examples of resins include phenolic resins, epoxy resins, polyimide resins, bismaleimide-triazine resins (BT resins), polyphthalamide (PPA), polyethylene terephthalate (PET), polyethylene naphthalate (PEN), and the like. The mounting board 10 may be a rigid mounting board, or a flexible mounting board which is capable of being fabricated by roll-to-roll method. The thickness of the mounting board 10 may be chosen as appropriate. The rigid mounting board may be a thin rigid mounting board that is flexible or bendable.

From the standpoints of thermal resistance and light fastness, ceramics may be chosen as the material of the mounting board 10. Examples of ceramics include aluminum oxide, mullite, forsterite, glass ceramics, nitride-based materials (e.g., AlN), carbide-base materials (e.g., SiC), low temperature co-fired ceramics (LTCCs), and the like.

The mounting board 10 may be made of a composite material; for example, inorganic fillers such as glass fibers, $SiO_2$, $TiO_2$, or $Al_2O_3$ may be mixed in the aforementioned resins for improved mechanical strength of the mounting board 10, reduction in the thermal coefficient of thermal expansion, improved light reflectance, and so on. For example, a fiberglass-reinforced plastic (e.g., glass epoxy resin) or the like may be used as the material of the mounting board 10.

The mounting board 10 may be a wiring board having a conductor wiring layer on its upper face 10a for supplying power to the light sources 20. At least the upper face 10a of the mounting board 10 may have electrically insulative portions; for example, a metal plate having an insulating layer provided on its surface may be used as the mounting board 10. The mounting board 10 may have a multilayer structure.

Conductor Wiring Layer 12

Figure 2:
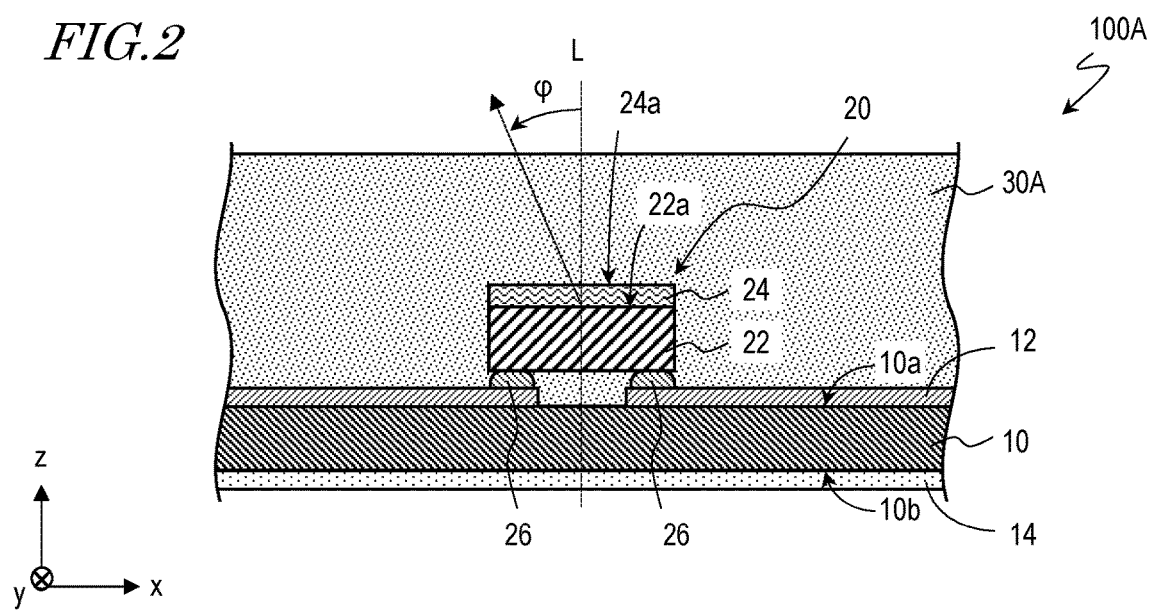
FIG. 2 is a schematic cross-sectional view showing an enlargement of a portion of FIG. 1.

FIG. 2 schematically shows an enlargement of a portion of FIG. 1. In the construction illustrated in FIG. 2, the light emitting device 100A includes a conductor wiring layer 12 which is provided on the upper face 10a of the mounting board 10. The conductor wiring layer 12 includes an interconnection pattern(s) for supplying external power to each light source 20. Here, each light source 20 includes its positive electrode and negative electrode connected to the conductor wiring layer 12 via bonding members 26 described below, whereby the light source 20 is electrically connected and fixed to the conductor wiring layer 12.

The material of the conductor wiring layer 12 may be appropriately chosen, depending on the material, production method, etc., of the mounting board 10. In the case of using a ceramic as the material of the mounting board 10, for example, a refractory metal which can be baked simultaneously with the ceramic of the mounting board 10 may be chosen as the material of the conductor wiring layer 12. For example, the conductor wiring layer 12 may be constructed of a high melting point metal such as tungsten or molybdenum. In the case where a glass epoxy resin is used as the material of the mounting board 10, for example, a material which permits easy processing may advantageously be chosen as the material of the conductor wiring layer 12. For example, a metal layer of copper, nickel, or the like which has been formed by plating, sputtering, vapor deposition, or with joining by pressing can be used as the conductor wiring layer 12. As the method of forming the conductor wiring layer 12, printing, photolithography, or the like may be applied, whereby a metal layer including a predetermined interconnection pattern(s) can be relatively easily formed.

The conductor wiring layer 12 may include a plurality of interconnection patterns. Each interconnection pattern may be connected to a driver that drives the light sources 20. For example, each interconnection pattern may electrically connect one of the plurality of light sources 20 to the driver. Alternatively, two or more light sources 20 may be connected in series to each interconnection pattern. The driver may be provided on an additional mounting board, other than the mounting board 10, so as to be electrically connected to the conductor wiring layer 12; alternatively, the driver may be provided on the mounting board 10 so as to be electrically connected to the conductor wiring layer 12. When the driver is connected to a conductor wiring layer 12 including interconnection patterns having two or more light sources 20 connected in series thereto, the plurality of light sources 20 can be driven in one-by-one manner, or in segment-by-segment manner (where each segment includes more than one light source 20), whereby the light emitting device 100A can achieve a local dimming operation.

Figure 3:
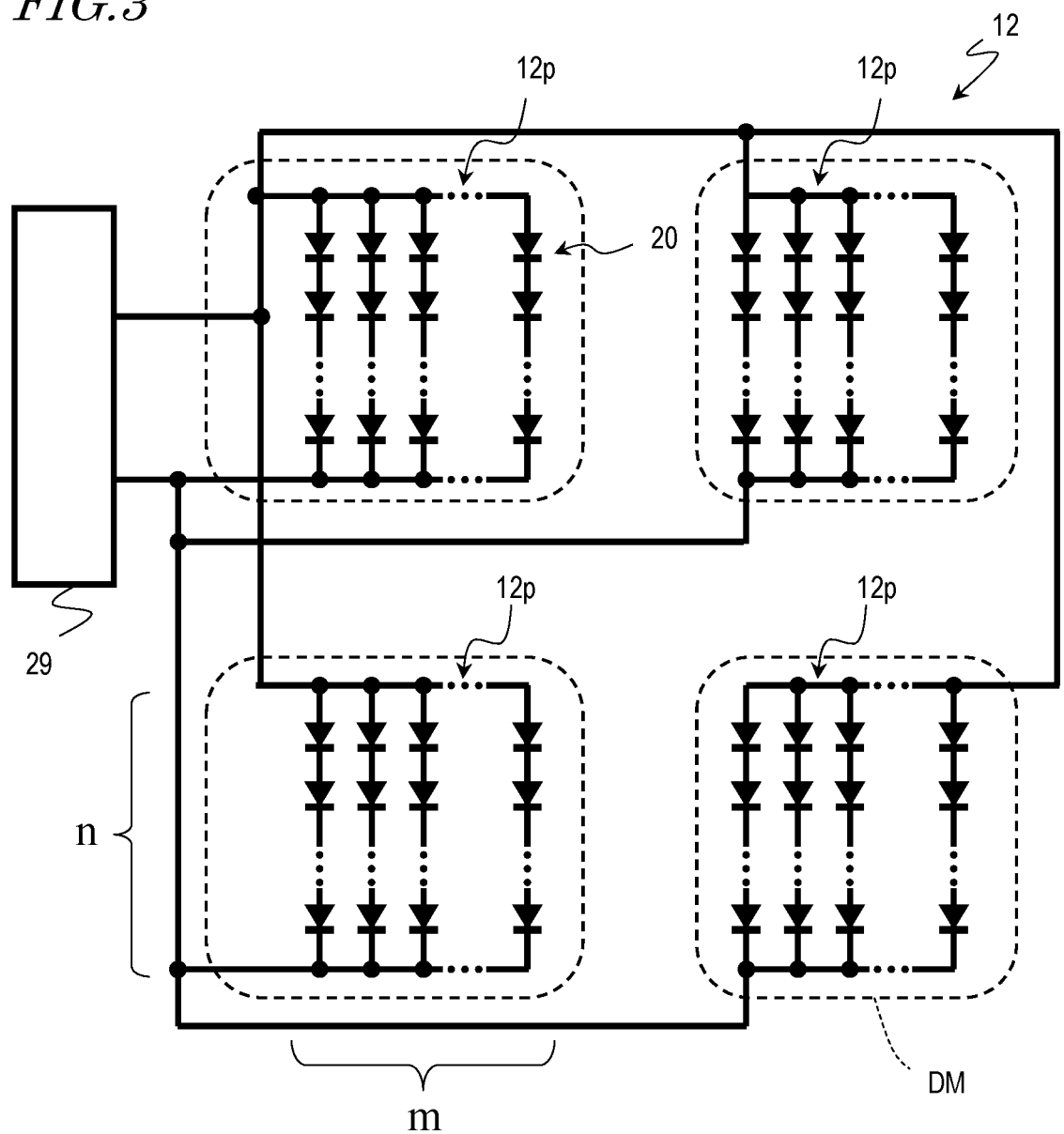
FIG. 3 is a diagram showing exemplary interconnection patterns in a conductor wiring layer 12.

FIG. 3 shows exemplary interconnection patterns in the conductor wiring layer 12. In the construction illustrated in FIG. 3, the conductor wiring layer 12 includes a plurality of interconnection patterns 12p each having n*m pieces of the light source 20 connected thereto (where the symbol "*" indicates multiplication). Each interconnection pattern 12p includes m groups of series connections of light sources 20 in parallel, such that each of the m groups of the series connections includes n pieces of light source 20. The interconnection patterns 12p are connected to the driver 29, and are driven on the basis of each region DM including n*m light sources 20 as a unit. In other words, such a circuit construction enables local dimming operation on the basis of each region DM including the n*m light sources 20 as a unit.

The manner of interconnection in the conductor wiring layer 12 is not limited to any particular implementation. The method by which the driver drives the light sources 20 via the conductor wiring layer 12 may be a passive matrix method or an active matrix method.

The conductor wiring layer 12 may have a multilayer structure. For example, the conductor wiring layer 12 may include a pattern of high melting point metal which is formed by the aforementioned method, and a layer formed on this pattern by plating, sputtering, vapor deposition, or the like, this layer containing other metals such as nickel, gold, and/or silver.

Metal Layer 14

As shown in FIG. 2, a metal layer 14 may be provided on the lower face 10b of the mounting board 10. The metal layer 14 may be provided across the entire lower face 10b, for example, thus to improve the heat-dissipation of the mounting board 10. The metal layer 14 may include wiring lines or the like, and may include a circuit pattern of driving circuitry for driving the light sources 20, for example. The components for configuring the driving circuit (e.g., the aforementioned driver) may be mounted on the circuit pattern of the metal layer 14. In this case, the metal layer 14 is electrically connected to the conductor wiring layer 12 through via-conductors or the like that are provided in the mounting board 10.

Light Source 20

The plurality of light sources 20 are provided and supported on the upper face 10a side of the mounting board 10. Each light source 20 at least includes a light-emitting element 22 having an upper face 22a. As the light-emitting element 22, semiconductor light-emitting elements known in the art, such as a semiconductor laser or a light-emitting diode, can be used. In the present embodiment, a light-emitting diode is exemplified as the light-emitting element 22.

The light-emitting element 22 includes, for example, a light-transmitting substrate, and a semiconductor multilayer structure which is layered on or above the light-transmitting substrate. The semiconductor multilayer structure includes an n type semiconductor layer, a p type semiconductor layer, and an active layer interposed therebetween, with an n-side electrode and a p-side electrode being respectively electrically connected to the n type semiconductor layer and the p type semiconductor layer. In the present embodiment, the n-side electrode and the p-side electrode are positioned on the opposite face from the upper face 22a. By the bonding members 26, the n-side electrode and the p-side electrode are electrically connected and fixed on the conductor wiring layer 12, which is provided on the upper face 10a of the mounting board 10. In other words, here, the light sources 20 are mounted on the mounting board 10 by flip chip bonding manner. The n-side electrode and the p-side electrode may be provided on an identical face as in this example, or may respectively be provided on different faces. The light-emitting element 22 may be a bare chip; alternatively, it may be a contained in a package, with reflectors opposing the lateral faces of the chip. The light-emitting element 22 may have a lens or the like to broaden the range of outgoing angles of light outgoing from the upper face 22a.

As is schematically shown in FIG. 2, each of the light sources 20 may include a light reflecting layer 24 on the upper face 22a of the light-emitting element 22. In the case where the light reflecting layer 24 covers the entire upper face 22a of the light-emitting element 22 as in the example shown in FIG. 2, light would be extracted from the lateral faces of the light-emitting element 22. By providing the light reflecting layer 24 on the upper face 22a of the light-emitting element 22, light travelling upward from the light-emitting element 22 (i.e., in the z direction here) is reflected by the light reflecting layer 24, whereby the amount of light immediately above the light-emitting element 22 is reduced. As a result of this, a batwing light distribution characteristic is achieved. Such a construction has advantages in reducing the thickness of the light sources 20 because one does not need lenses or the like to obtain a batwing light distribution characteristic. The light reflecting layer 24 may be a multi-layer dielectric film, for example. The light reflecting layer 24 may be a metal film.

Figure 4:
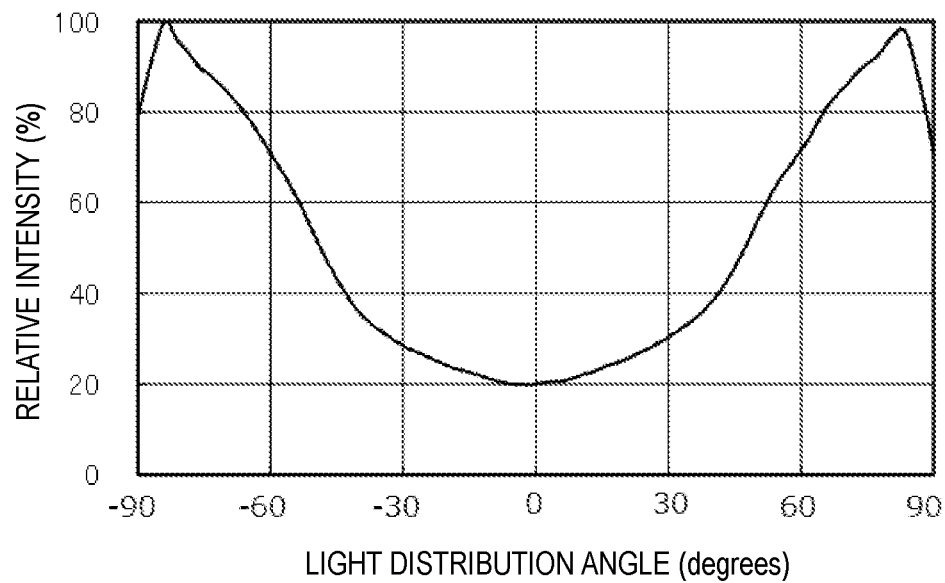
FIG. 4 is a diagram showing an example of a light distribution characteristic profile of light travelling out from a light source 20.

FIG. 4 shows an example of a light distribution characteristic profile of light outgoing from a light source 20. The light source 20 may have a batwing light distribution characteristic. When each light source 20 has a batwing light distribution characteristic, the light source can have an expanded light distribution, while the amount of light immediately above the light source 20 is reduced, whereby luminance non-uniformity is suppressed. Broadly defined, a batwing light distribution characteristic means an emission intensity distribution such that, given an optical axis L which is perpendicular to the upper face of the light source 20 being defined as 0°, high emission intensity exists at light distribution angles (i.e., φ in FIG. 2) whose absolute values are greater than 0°. Narrowly defined, it means an emission intensity distribution in which the highest emission intensity exists in the range of approximately 45° to approximately 90°. In other words, a batwing light distribution exhibits a profile whose central portion is darker than its outer periphery.

As the light-emitting element 22, an element which emits light of an appropriate wavelength may be selected. For example, as an element to emit blue or green light, a light-emitting element constructed of a nitride semiconductor ($In_xAl_yGa_{1-x-y}N$, $0 \leq x$, $0 \leq y$, $x+y \leq 1$) may be used. As an element to emit red light, a light-emitting element containing a semiconductor such as GaAlAs, AlInGaP, GaAsP, or GaP may be used. Furthermore, a semiconductor light-emitting element constructed of any other material may be used. Various emission wavelength can be selected based on the material of the semiconductor layer in the semiconductor multilayer structure and the mixed crystal compositions thereof. The compositions, emission colors, sizes, numbers, etc., of the light-emitting elements used may be appropriately chosen depending on the purpose. Here, elements to emit blue light are adopted as the light-emitting elements 22, and light sources to emit blue light are exemplified as the light sources 20. However, this is merely an exemplification for explanatory purposes, and it will be appreciated that the plurality of light sources 20 may also include light sources to emit light of other colors. For example, three types of light sources to respectively emit light of red, blue, and green may of course be disposed on the mounting board 10. For example, light sources to emit blue light and light sources to emit other colors may be arrayed on the mounting board 10, whereby the light outgoing from the light emitting device 100A can achieve improved color rendering.

Bonding Member 26

The bonding members 26 (see FIG. 2) fix the light-emitting element 22 onto the conductor wiring layer 12. Here, the bonding members 26 also function to electrically connect the light-emitting element 22 to the conductor wiring layer 12. The bonding members 26 may be constructed of an Au-containing alloy, an Ag-containing alloy, a Pd-containing alloy, an In-containing alloy, a Pb—Pd-containing alloy, an Au—Ga-containing alloy, an Au—Sn-containing alloy, an Sn-containing alloy, an Sn—Cu-containing alloy, an Sn—Cu—Ag-containing alloy, an Au—Ge-containing alloy, an Au—Si-containing alloy, an Al-containing alloy, a Cu—In-containing alloy, or a mixture of a metal and flux. In the case where the p-side electrode and the n-side electrode and the conductor wiring layer 12 are electrically connected via wires or the like, the bonding members 26 only need to be able to fix regions of the light-emitting element 22 other than the p-side electrode and the n-side electrode onto the upper face 10a of the mounting board 10, and the bonding members 26 do not need to electrically connect the light-emitting element 22 and the conductor wiring layer 12 to each other.

As the bonding member(s) 26, members in liquid form, paste form, solid form (e.g., sheets, blocks, powder, or wires) may be used; any appropriate member may be chosen depending on the composition of the light-emitting elements, the shape of the mounting board, and so on. Each bonding member 26 may be composed of a single member, or a plurality of members may be combined to serve as a bonding member 26.

FIG. 1 is referred to again. The plurality of light sources 20 constitute a two-dimensional array on the upper face 10a of the mounting board 10. As shown in FIG. 1, here, the plurality of light sources 20 are arrayed along the x direction. Although not shown in FIG. 1, which shows a zx cross section, the light sources 20 are also arranged along the y direction. In other words, here, the plurality of light sources 20 constitute a two-dimensional array along two orthogonal directions, i.e., the x direction and the y direction. The light emitting device 100A may include e.g. several thousand or more light sources 20 on the mounting board 10. It will be appreciated that, without being limited to this example, the plurality of light sources 20 may constitute any appropriate array.

The array pitch P of the light sources 20 is the distance between the centers of two adjacent light sources 20 (which may also be regarded as the distance between optical axes L), with a value in the range of not less than 0.1 mm but less than 5 mm, for example. The value of the array pitch P may be changed as necessary, depending on the application of the light emitting device 100A, the size of the light-emitting elements 22, the construction of the scatter reflection portions 50 (described later), the distance H from the upper face 10a of the mounting board 10 to the scatter reflection portions 50, and so on. The array pitch P may be in the range of not less than 0.2 mm but less than 2 mm. Alternatively, it may be in the range of not less than 2 mm but less than 4 mm. The array of light sources 20 may be equally spaced or unequally spaced along the x direction. For example, light sources 20 may be arrayed so as to become more spaced apart from the center toward the periphery. The array pitches P of the light sources 20 along the x direction, and the array pitches P of the light sources 20 along the y direction may be equal or unequal.

Wavelength Conversion Layer 30A

The wavelength conversion layer 30A absorbs at least a portion of light outgoing from the light sources 20, and re-emits light of a wavelength which is different from the wavelength of the light outgoing from the light sources 20. The wavelength conversion layer 30A may contain wavelength converting material, such as phosphor or coloring agents, and absorbs a portion of blue light from the light sources 20 and re-emits yellow light. Alternatively, the wavelength conversion layer 30A may absorb a portion of blue light from the light sources 20 and re-emit green light and/or red light.

As schematically shown in FIG. 1, the wavelength conversion layer 30A is located at least between the plurality of light sources 20 and the light diffuser 70 (described later). In the present embodiment, the wavelength conversion layer 30A covers over not only the upper face of each light source 20, but also substantially entire of the light source 20, including its lateral faces. In other words, herein, a portion of the wavelength conversion layer 30A is located also between two adjacent light sources 20.

As described above, the array of light sources 20 on the mounting board 10 may each have a pitch as narrow as less than 5 mm. The each array pitch P being as narrow as less than about 5 mm allows the power that is supplied to each light source 20 to be reduced, while also ensuring sufficient luminance on the upper face 70a side of the light diffuser 70 for a backlight. The reduced array pitch P allows the power that is supplied to each light source 20 to be reduced, therefore, deterioration of the wavelength converting material due to heat generated by the light sources 20 can be inhibited even in the case where the wavelength conversion layer 30A covers substantially entire of each light source 20. With an embodiment of the present disclosure, the wavelength converting material does not need to be highly resistant against heat or light.

The wavelength conversion layer 30A can be formed by disposing a resin material onto the mounting board 10 on which the light sources 20 are disposed, and allowing it to cure. The above mentioned resin material can be obtained by allowing wavelength converting material to be dispersed in an epoxy resin, silicone resin, or a mixed resin thereof. From the standpoints of light resistance and ease of molding, a silicone resin may advantageously be used as the material in which wavelength converting material is dispersed. The material to compose the wavelength conversion layer 30A may further contain a light diffusing material or the like. To adjust viscosity of the material for composing the wavelength conversion member 30A, other than adjusting the viscosity of the material itself in which wavelength converting material is dispersed, a light diffusing member or the like may be added in the material for composing the wavelength conversion layer 30A.

The wavelength conversion layer 30A may contain wavelength converting material which converts blue light into yellow light, for example. In this case, a portion of the blue light from the light sources 20 is absorbed by the wavelength conversion layer 30A, and yellow light is re-emitted from the wavelength conversion layer 30A. This can realize white light by mixture of the blue light from the light sources 20 and the yellow light from the wavelength conversion layer 30A. The wavelength conversion layer 30A may contain wavelength converting material which converts blue light into green light, and wavelength converting material which converts blue light into red light. In this case, white light is obtained based on the combination of blue light, green light, and red light.

Examples of wavelength converting material which convert blue light into yellow light include YAG-based phosphors. Examples of wavelength converting material which convert blue light into green light include ß-SiAlON phosphors; and examples of wavelength converting material which convert blue light into red light include fluoride-based phosphors, e.g., KSF-based phosphors, and nitride-based phosphors, e.g., CASN. When the wavelength conversion layer 30A contains a ß-SiAlON phosphor and a fluoride-based phosphor such as a KSF-based phosphor as the wavelength converting material, the range of color reproduction of the light emitting device 100A can be expanded. A quantum dot phosphor may be used as a phosphor. In the case where the wavelength conversion layer 30A contains wavelength converting material, the light-emitting element 22 may advantageously contain a nitride semiconductor ($In_xAl_yGa_{1-x-y}N$, $0 \leq x$, $0 \leq y$, $x+y \leq 1$) which can emit light of a short wavelength capable of efficiently excite the wavelength converting material.

Scatter Reflection Portion 50

The light emitting device 100A includes a plurality of scatter reflection portions 50 at the light diffuser 70 side of the wavelength conversion layer 30A. Herein, the plurality of scatter reflection portions 50 are disposed on an upper face 30a of the wavelength conversion layer 30A, such that each of the plurality of scatter reflection portions 50 is located above at least a portion of the upper face (which herein is the surface 24a of the light reflecting layer 24) of a light source 20. At least a portion of each scatter reflection portion 50 may be located above the optical axis L of the light source 20, for example. Herein, the scatter reflection portions 50 are disposed in a plurality of regions on the wavelength conversion layer 30A correspondingly to the plurality of light sources 20, so as to cause scattering and reflection of incident light.

Figure 5:
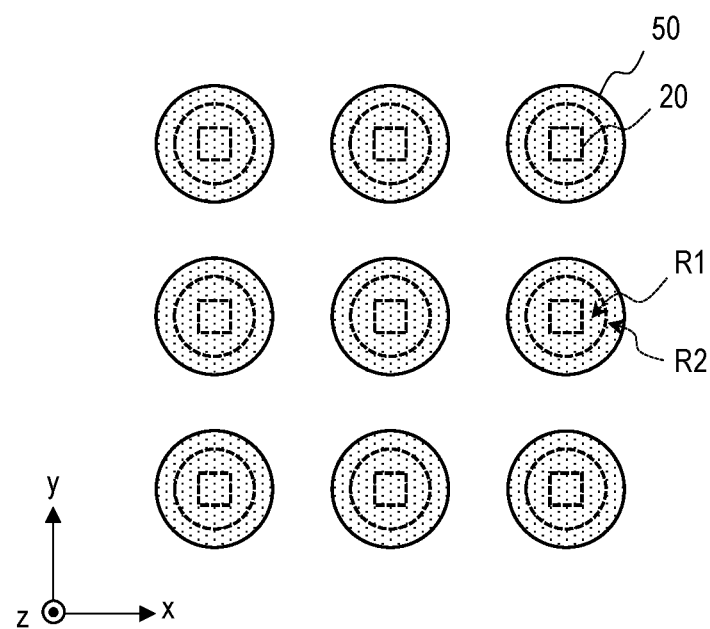
FIG. 5 is an upper plan view schematically showing an example of relative positioning between scatter reflection portions 50 and upper faces of the light sources 20.

FIG. 5 shows an example of relative positioning between the scatter reflection portions 50 and the upper faces of the light sources 20 in an upper plan view of the light emitting device 100A. The scatter reflection portions 50 may be provided e.g. in a plurality of regions correspondingly to the light sources 20; in this example, each scatter reflection portion 50 is located above the upper face of the respective light source 20.

For example, in upper plan view, the scatter reflection portion 50 is located in a first region R1 that is in the central region of the scatter reflection portion 50 and in a second region R2 that includes portions lying outside of the first region R1. Generally speaking, light outgoing from the light source 20 has a high light emission intensity on the optical axis L, but relatively low light emission intensities at light distribution angles whose absolute values are greater than 0°, where the optical axis L of the light source 20 is defined as 0°. Therefore, by providing the scatter reflection portion 50 that causes scattering and reflection of the light traveling immediately above the light source 20, luminance non-uniformity on the upper face 70a of the light diffuser 70 can be suppressed, while also reducing the distance H from the upper face 10a of the mounting board 10 to the scatter reflection portion 50. Herein, the distance H is substantially equal to the distance from the upper face 10a of the mounting board 10 to the upper face 30a of the wavelength conversion layer 30A, which may be 1 mm or less, for example. However, this value is only exemplary. The distance H may be other values depending on the application of the light emitting device 100A, the array pitches P of the light sources, the construction of the scatter reflection portions 50, and so on. For example, in an application of a display device for a tablet-type computer, the distance H may be, for example, not less than 0.5 mm and not more than 1.2 mm, and preferably not less than 0.8 mm and not more than 1 mm. In an application of a display device for a laptop computer, the distance H may be e.g. not less than 0.5 mm and not more than 1.5 mm, and preferably not less than 0.8 mm and not more than 1.2 mm. In an application of a display device for a smartphone or the like, the distance H may be e.g. not less than 0.3 mm and not more than 0.8 mm, and preferably not less than 0.4 mm and not more than 0.6 mm. The ratio of the distance H to the array pitch P (H/P) may be, for example, not less than 0.1 and not more than 0.5, and preferably not less than 0.2 and not more than 0.3.

Although FIG. 5 illustrates each scatter reflection portion 50 in upper plan view, to be a circle which is centered around the optical axis of the respective light source 20, the shape of the scatter reflection portion 50 is not limited to a circle. Depending on the light distribution characteristic of the light source 20, the shape of the scatter reflection portion 50 may be chosen as appropriate, for example, an ellipse, a rectangle, etc., so that light can be scattered more uniformly. Although this example illustrates the plurality of scatter reflection portions 50 as being discrete from one another, adjacent scatter reflection portions 50 may share a common portion. Alternatively, the plurality of scatter reflection portions 50 may be arranged in proximity, so that a scatter reflection layer that includes the plurality of scatter reflection portions 50 is created across the entire upper face 30a of the wavelength conversion layer 30A. In the case where the emission intensity is weaker on the optical axis of the light source 20 than around the optical axis because of the light source 20 having a batwing light distribution characteristic, etc., the scatter reflection portions 50 may have an annular shape in upper plan view, for example. The scatter reflection portions 50 may be located above at least a portion of the upper face of each light source 20.

Each scatter reflection portion 50 may be a pattern of a certain material that is capable of causing scatter reflection of light (which herein is blue light) going out from the light source 20. Each scatter reflection portion 50 may be, for example, a metal pattern that is formed by vapor deposition technique, printing technique, photolithography, etc. Alternatively, each scatter reflection portion 50 may be a pattern constructed of a material which contains particles of reflective material that are dispersed in resin. As the particles dispersed in the resin, oxide particles may be used, e.g., titanium oxide, aluminum oxide, zirconium dioxide, or silicon dioxide. The oxide particles may have an average particle diameter on the order of, for example, not less than 0.05 μm and not more than 30 μm. A photocurable resin whose main component is an acrylate, an epoxy, or the like may be used as the resin in which to disperse particles of reflective material, thereafter allowing the uncured resin containing the reflective material to be disposed on the upper face 30a of the wavelength conversion layer 30A, the scatter reflection portions 50 may be formed by ultraviolet irradiation or the like. Photocuring of the resin may be performed by the outgoing light from the light source 20. The uncured resin in which the particles of reflective material are dispersed may be directly disposed on the upper face 30a of the wavelength conversion layer 30A by for example, printing technique or ink jet technique.

Figure 6A:
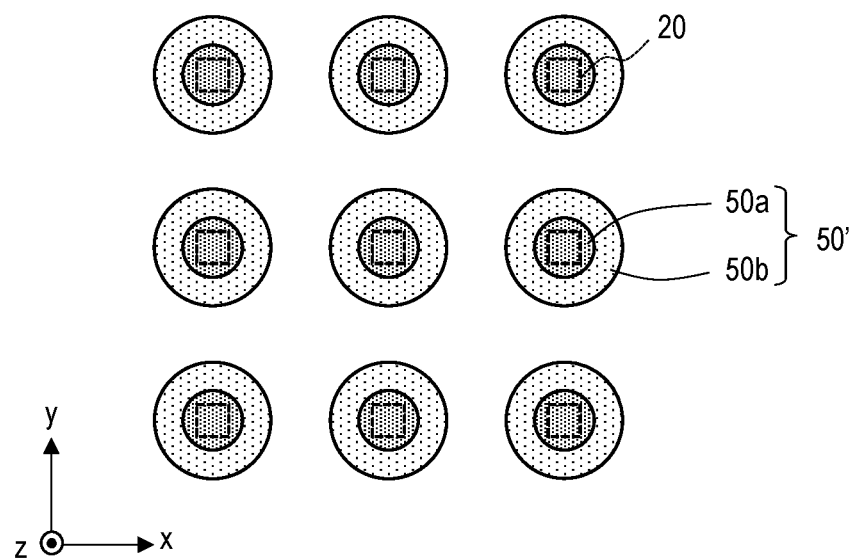
FIG. 6A is an upper plan view showing another example of scatter reflection portions.

The particles of reflective material that causes scattering of light in each scatter reflection portion 50 may be uniformly distributed, or provided at higher densities in regions in which the light distribution angle of the light source 20 has smaller absolute values than in regions with greater absolute values of light distribution angle. A scatter reflection portion 50' illustrated in FIG. 6A includes a first portion 50a and a second portion 50b. The first portion 50a and the second portion 50b may respectively be provided in the first region R1 and the second region R2 (see FIG. 5) as described above. For example, the first portion 50a and the second portion 50b may be located immediately above the light source 20 and around the first portion, respectively. The first region R1 may be formed so that, it is equal in size to the light source 20, or larger than the light source 20, in upper plan view.

The density of the particles of reflective material in the first portion 50a is greater than the density of the particles of reflective material in the second portion 50b. As used herein, the density of particles is represented by, for example, a number density, which represents the number of particles per unit area in the plane of upper plan view, in other words, the xy plane. As in the scatter reflection portion 50', by allowing the first portion 50a which contains the particles of reflective material with a relatively high density to be in the region with higher illuminance, light uniformity at the light-emitting plane of the light emitting device can be more effectively enhanced.

Figure 6B:
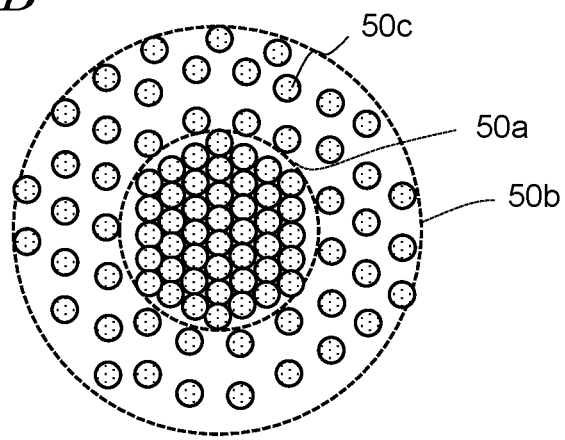
FIG. 6B is an upper plan view schematically showing a detailed structure of a scatter reflection portion 50' shown in FIG. 6A.
Figure 6C:
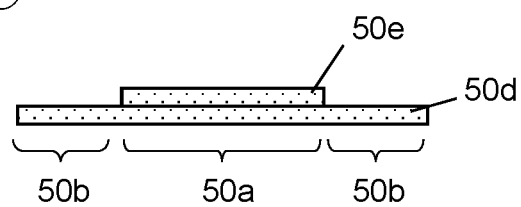
FIG. 6C is a schematic cross-sectional view showing another exemplary structure for the scatter reflection portion 50'.

By, for example, a printing technique or ink jet technique, the scatter reflection portion 50' can be formed by, as shown in FIG. 6B, minute regions 50c of uncured resin (in which particles of reflective material are dispersed) can be disposed densely in the first portion 50a, but disposed with a lower density in the second portion 50b than in the first portion 50a. Alternatively, as shown in FIG. 6C, a first layer 50d being uncured resin in which particles of reflective material are dispersed may be formed in the first portion 50a and in the second portion 50b, with a second layer 50e being exclusively formed in the first portion 50a so as to lie on the first layer 50d. With the structure shown in FIG. 6B or FIG. 6C, the scatter reflection portion 50' satisfies the aforementioned relationship regarding density of particles of reflective material in the scatter reflection portion 50' in the xy plane. However, in the case where the light source 20 includes a light reflecting layer 24 covering the entire upper face 22a of the light-emitting element 22, the region with light distribution angles near 0° may become dark, as the distance H from the upper face 10a of the mounting board 10 to the scatter reflection portion 50 is decreased to a certain degree. In such a case, it is not required that the density of the particles of reflective material in the first portion 50a be greater than the density of the particles of reflective material in the second portion 50b.

Light Diffuser 70

FIG. 1 is referred to. The light emitting device 100A includes a light diffuser 70 located above the plurality of light sources 20. In this example, a light-transmitting layer 60 is formed on the wavelength conversion layer 30A, which covers over the light sources 20, and the light diffuser 70 lies over the light-transmitting layer 60. The light-transmitting layer 60 is a layer of resin, for example, a silicone resin, a modified silicone resin, an epoxy resin, a phenolic resin, a polycarbonate resin, an acrylic resin, a trimethylpentene resin, or a polynorbornene resin, or a layer containing two or more of such resins. By forming the light-transmitting layer 60 so as to cover the scatter reflection portions 50, a flat surface is obtained. Forming a flat surface makes it easy to dispose the light diffuser 70 above the plurality of light sources 20.

The light diffuser 70 has an upper face 70a and a lower face 70b, and is disposed on the light-transmitting layer 60 so that the lower face 70b faces toward the light sources 20. In the case where the light emitting device 100A is used as a backlight of a liquid crystal display device, for example, a liquid crystal panel is disposed at the upper face 70a side of the light diffuser 70.

The light diffuser 70 diffuses incident light and transmits it. The light diffuser 70 may be constructed of a material which does not absorb much visible light, for example, a polycarbonate resin, a polystyrene resin, an acrylic resin, or a polyethylene resin. The light-diffusing structure can be realized using the light diffuser 70 having a rough surface, or the light diffuser 70 containing materials respectively having different refractive indices dispersed therein. As the light diffuser 70, any member that is commercially available as a light-diffusing sheet or a diffuser film, or under some other designation, may be used. By disposing a light-transmitting adhesive on the lower face 70b of the light diffuser 70, and attach the light diffuser 70 onto the wavelength conversion layer 30A so that the layer of light-transmitting adhesive faces the upper face 30a of the wavelength conversion layer 30A, the scatter reflection portions 50 can be embedded in the layer of light-transmitting adhesive. The light-transmitting adhesive may be cured with this state, whereby a structure in which the light-transmitting layer 60 and the light diffuser 70 are stacked on the wavelength conversion layer 30A can already be obtained, such as that shown in FIG. 1.

Together with the light diffuser 70, some other optical elements that are commercially available for use in a backlight may also be employed. The light emitting device 100A may further include a prism array layer, a reflection-type polarization layer (e.g., a reflective polarizer), and so on, for example. The prism array layer can include an array of a plurality of prisms each extending in a predetermined direction, and cause light which is incident from various directions to be refracted in a direction (which herein is the positive z direction) toward a display panel (e.g., a liquid crystal panel) that is opposed to the light emitting device 100A. For example, by disposing the prism array layer on the upper face 70a side of the light diffuser 70, an enhanced luminance can be obtained as the light emitting device 100A is viewed from the front (i.e. the z direction). The reflection-type polarization layer is, for example, disposed so as to be more distant from the light diffuser 70 than is the prism array layer, and selectively transmit any light of a polarization direction that matches the transmission axis of a polarizer which is mounted at the backlight side of the display panel (e.g., a liquid crystal panel), while causing light which is polarized in a direction perpendicular to the transmission axis to be reflected toward the mounting board 10. A portion of the returned light from the reflection-type polarization layer is again reflected by the prism array layer, the light diffuser 70, or the wavelength conversion layer 30A. In this course, the polarization direction changes, so that a portion of light whose polarization direction is parallel to the transmission axis of the polarizer of the liquid crystal panel passes through the reflection-type polarization layer and enter the liquid crystal panel. Thus, by providing the reflection-type polarization layer, light outgoing from the light emitting device 100A can have a uniformized polarization direction, thereby allowing polarized light that is effective for a luminance improvement of the display panel to go out with high efficiency.

The light emitting device 100A can be produced by forming in order from the wavelength conversion layer 30A, the scatter reflection portions 50, and the light-transmitting layer 60 on the mounting board 10 on which the plurality of light sources 20 are disposed, and placing the light diffuser 70 on the light-transmitting layer 60. The scatter reflection portions 50 may be directly formed on the upper face 30a of the wavelength conversion layer 30A by a printing technique or the like. The aforementioned prism array layer, reflection-type polarization layer, and light diffuser 70 may be spaced apart from one another along the z direction, or they may be in contact with each other on at least one interface therebetween. However, from the standpoint of reducing the thickness of the light emitting device 100A, it is more advantageous for two adjacent optics to be in contact with each other.

Operation and Effects of Light Emitting Device 100A

When the light emitting device 100A is utilized as a surface light source, the non-uniformity in luminance and color at the light extraction face of the light emitting device 100A, in other words, the upper face 70a of the light diffuser 70, is expected to be little. A display device generally faces a demand for reduced thickness from a design, aesthetics, or functional standpoint. Therefore, when the light emitting device 100A is used as a backlight, it may be advantageous if the thickness or height of the light emitting device 100A is small. However, merely reducing the distance between a light-emitting element and a light diffuser in a direct lit light emitting device would increase the light which directly enters the light diffuser from the light-emitting element, therefore, generally speaking, the luminance non-uniformity would increase at the upper face of the light diffuser.

As has been described with reference to FIG. 1 and the like, in the above embodiment, the plurality of light sources 20 are densely mounted at the upper face 10a side of the mounting board 10, and the wavelength conversion layer 30A is formed on the mounting board 10 in such a manner as to integrally covering the set of light sources 20. Therefore, the array pitches P of the light sources 20 can be reduced as compared to a case where a plurality of light-emitting elements, each being individually encapsulated with a material in which at least one phosphor is dispersed in a resin, are disposed on the mounting board 10, for example. For instance, the array pitch P of the light sources 20 can be reduced to several mm. With reduction in array pitches P of the light sources 20, the luminance non-uniformity at the upper face 70a of the light diffuser 70 is inhibited, so that the thickness or height of the light emitting device can be reduced as compared to a case where a plurality of individually encapsulated light-emitting elements are disposed on the mounting board 10. As described above, a dense arrangement of the plurality of light sources 20 may enable a reduction in the power supply to each light source 20, while also ensuring sufficient luminance. This can inhibit the wavelength conversion layer 30A from being affected to heat generated by the light sources 20, while ensuring sufficient luminance. Moreover, the wavelength conversion layer 30A integrally covering over the plurality of light sources 20 provides the wavelength conversion function as well as protecting the light-emitting element 22, there is no need to individually encapsulate a plurality of light-emitting elements and fix a wavelength conversion layer thereabove by using supporting members. Therefore, embodiments of the present disclosure are advantageous in reducing the thickness of the light emitting device.

On the upper face 30a of the wavelength conversion layer 30A, the scatter reflection portions 50 are provided. For example, by providing scatter reflection portions 50, in which particles are dispersed in a resin, on the upper face 30a of the wavelength conversion layer 30A, scatter reflection of light from the wavelength conversion layer 30A can be realized by the particles in the scatter reflection portions 50. Moreover, the scatter reflection portions 50 can be directly formed on the upper face 30a of the wavelength conversion layer 30A, misalignments between the light sources 20 on the mounting board 10 and the scatter reflection portions 50 can be reduced, thus allowing each scatter reflection portion 50 to be disposed above at least a portion of the upper face of the light source 20 with an increased certainty.

Each light source 20 is a point light source, and the illuminance of the face which is illuminated by light outgoing from the light sources 20 is in inverse proportion to the distance squared. Therefore, in upper plan view, the light which is incident on the light-transmitting layer 60 has a higher illuminance in the first region R1 near immediately above the light source 20 than in the second region R2 (see FIG. 5) surrounding the first region R1. This is because the distance between the light source 20 and the upper face 30a of the wavelength conversion layer 30A is shorter in the first region R1 than in the second region R2. By disposing the plurality of scatter reflection portions 50 in a plurality of places on the wavelength conversion layer 30A correspondingly to the plurality of light sources 20, such that at least a portion of each of the scatter reflection portions 50 is located on the optical axis L of the light source 20 in a plan view, it enables scatter reflection of light immediately above the light source 20 and the vicinity thereof, for example. As a result, the light that is present near the optical axis L of the light source 20, which has a high luminous flux density, can be selectively diffused to further reduce luminance non-uniformity.

Each light source 20 may have a batwing light distribution characteristic. When each light source 20 has a batwing light distribution characteristic, the illuminance in the first region R1 can be reduced, whereby the luminance non-uniformity on the upper face 70a of the light diffuser 70, which serves as the light extraction face of the light emitting device 100A, can be inhibited. In particular, luminance non-uniformity can be better suppressed if each light source 20 has a light distribution characteristic such that the amount of light at any elevation angle less than 20° with respect to the horizontal direction accounts for 30% or more of the entire amount of light. When each light source 20 has a batwing light distribution characteristic, the reflectance in the second portion 50b of each scatter reflection portion, which is located in the second region R2, may be increased over the reflectance in the first portion 50a, which is located in the first region R1.

According to an embodiment of the present disclosure, scatter reflection portions 50 are formed on the wavelength conversion layer 30A, so that the distance H from the upper face 10a of the mounting board 10 to each scatter reflection portion 50 can be reduced to about 1 mm, while inhibiting luminance non-uniformity. In other words, according to an embodiment of the present disclosure, a direct-type light emitting device with reduced thickness can be provided. The embodiments of the present disclosure are particularly advantageously applicable to the backlight of a display device of a mobile device that faces a stringent demand for reduced thickness, for example, a display device for use in a tablet-type computer, a smartphone, a smartwatch, or the like.

In the construction illustrated in FIG. 1, the wavelength conversion layer 30A includes at least one portion that covers the lateral faces of each light source 20. With such a construction, not only the light outgoing from the upper face of the light-emitting element 22, but also the light outgoing from its lateral faces can be effectively utilized.

On the mounting board 10, a conductor wiring layer 12 may be formed which includes a plurality of interconnection patterns, each including a series connection of two or more light sources 20. By connecting a driver to the interconnection patterns, it becomes possible to drive the plurality of light sources 20 in one-by-one manner, or in segment-by-segment manner (where each segment includes more than one light source 20), whereby the light emitting device 100A can achieve a local dimming operation.

Second Embodiment

Figure 7:
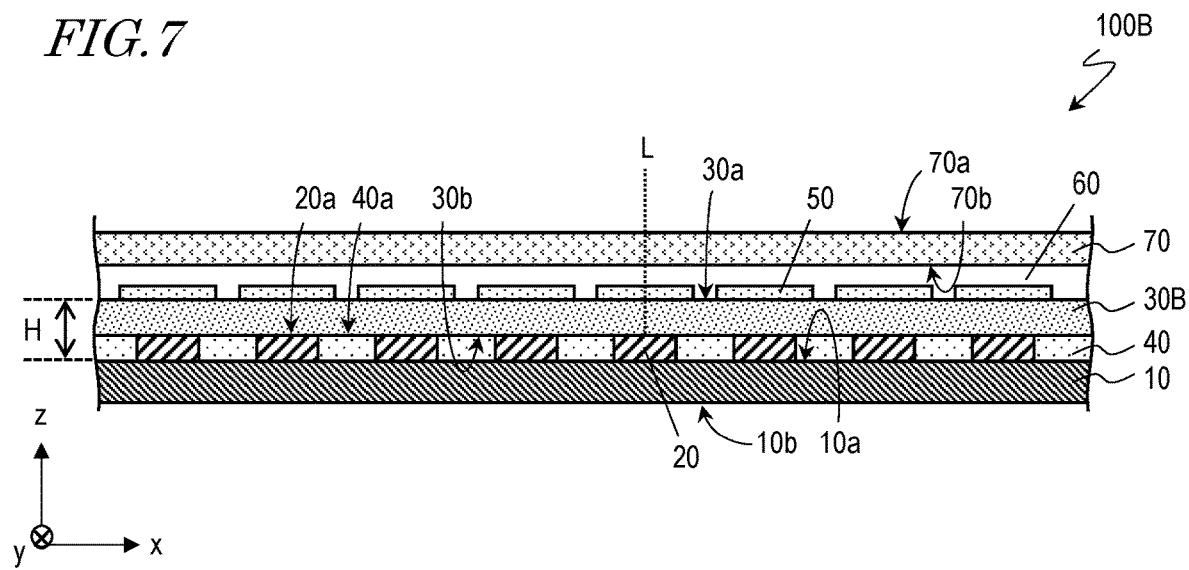
FIG. 7 is a schematic cross-sectional view of a light emitting device according to a second embodiment of the present disclosure.

FIG. 7 schematically shows a cross section of a light emitting device 100B according to a second embodiment of the present disclosure. Instead of the wavelength conversion layer 30A of the light emitting device 100A described with reference to FIG. 1 and the like, the light emitting device 100B shown in FIG. 7 includes a protection layer 40 covering the lateral faces of a plurality of light sources 20, and a wavelength conversion layer 30B provided on the protection layer 40. Hereinafter, details of the protection layer 40 and the wavelength conversion layer 30B will be described.

Protection Layer 40

The protection layer 40, which herein is a light-transmitting resin layer, is a layer that covers at least the lateral faces of the light sources 20. Herein, an upper face 40a of the protection layer 40 is aligned with upper faces 20a of the light sources 20 (e.g., the upper faces 22a of the light-emitting elements 22, or the surface 24a of the light reflecting layer 24) in a cross section view. The protection layer 40 can be formed by disposing an epoxy resin, a silicone resin, or a mixed resin thereof, onto the mounting board 10, on which the light sources 20 is provided, and allowing it to cure. After the light-transmitting resin material has cured, the resin layer which has resulted from cured resin material may be ground from the side that is opposite to the mounting board 10, thereby resulting in a protection layer 40 such that the upper faces 20a of the light sources 20 are exposed on its upper face 40a.

Wavelength Conversion Layer 30B

In the construction illustrated in FIG. 7, the wavelength conversion layer 30B has a sheet shape or a layer shape, and is disposed over the protection layer 40. As shown in FIG. 7, the wavelength conversion layer 30B is disposed on the protection layer 40 such that its lower face 30b is in contact with the upper faces 20a of the light sources 20.

As described above, according to an embodiment of the present disclosure, the light sources 20 can be arrayed with narrow pitches, therefore, sufficient luminance can be ensured while reducing the power supply to each light source 20. Reducing the power supply to each light source 20 makes it possible to reduce the heat from the light sources 20, whereby degradations of the wavelength converting material associated with heat can be inhibited. This makes it possible to adopt a construction as shown in FIG. 7, where the wavelength conversion layer 30B is in contact with the upper faces 20a of the light sources 20.

Similarly to the aforementioned wavelength conversion layer 30A, the wavelength conversion layer 30B absorbs at least a portion of light outgoing from the light sources 20, and emits light having a wavelength which is different from the wavelength of the light outgoing from the light sources 20. The wavelength conversion layer 30B may be constructed of any of the aforementioned materials to compose the wavelength conversion layer 30A. For example, as the material to compose the wavelength conversion layer 30B, a resin material may be used in which wavelength converting material such as a phosphor is dispersed. The wavelength conversion layer 30B can be directly formed on the protection layer 40, by disposing a material for composing the wavelength conversion layer 30B onto the upper face 40a of the protection layer 40 and the upper faces 20a of the light sources 20, for example. Alternatively, separately from the mounting board 10 on which the protection layer 40 is formed, a phosphor sheet may be provided such that the resin within the resin material in which wavelength converting material such as a phosphor is dispersed is at its B stage, and this sheet may be placed on the protection layer 40, thereby forming the wavelength conversion layer 30B. In the case where a sheet containing wavelength converting material such as a phosphor sheet is provided separately from the mounting board 10, instead of a resin, a ceramic material containing glass, alumina, etc., as the material in which one or more wavelength converting materials are to be dispersed.

In the second embodiment, too, scatter reflection portions 50 are disposed on the upper face 30a of the wavelength conversion layer (i.e., the wavelength conversion layer 30B herein). Providing the scatter reflection portions 50 on the wavelength conversion layer 30B can realize reduction in luminance non-uniformity, similarly to the first embodiment. The structure illustrated in FIG. 7 may be formed by, for example, forming a pattern on one surface of a sheet which contains wavelength converting material, and placing the sheet, on which the pattern(s) is/are formed, onto the protection layer 40. The pattern can be formed of a material containing a resin and particles of reflective material dispersed in the resin, and/or a metal pattern, by e.g. printing technique. However, placing the sheet, on which the pattern(s) is/are formed, onto the protection layer 40 may allow misalignments to occur between the light sources 20 on the mounting board 10 and the scatter reflection portions 50 on the wavelength conversion layer 30B, as compared to the first embodiment where scatter reflection portions 50 can be directly formed on the wavelength conversion layer 30A covering over the light sources 20. However, unlike in a construction as described in Japanese Patent Publication No. 2012-064476, where a sheet-like phosphor layer that has a reflective layer pattern on one of its principal faces is disposed at a distance from the upper faces of LED chips, the second embodiment can realize a structure that the wavelength conversion layer 30B is disposed in proximity to the upper faces 20a of the light sources 20. This can be more advantageous than the conventional construction in terms of reducing misalignments. The material to configure the wavelength conversion layer 30B may be disposed on the upper face 40a of the protection layer 40 and the upper faces 20a of the light sources 20 in order to form the wavelength conversion layer 30B on the protection layer 40, and thereafter the scatter reflection portions 50 may be formed on the wavelength conversion layer 30B, whereby misalignments can be inhibited similarly to the first embodiment.

Variants

Figure 8:
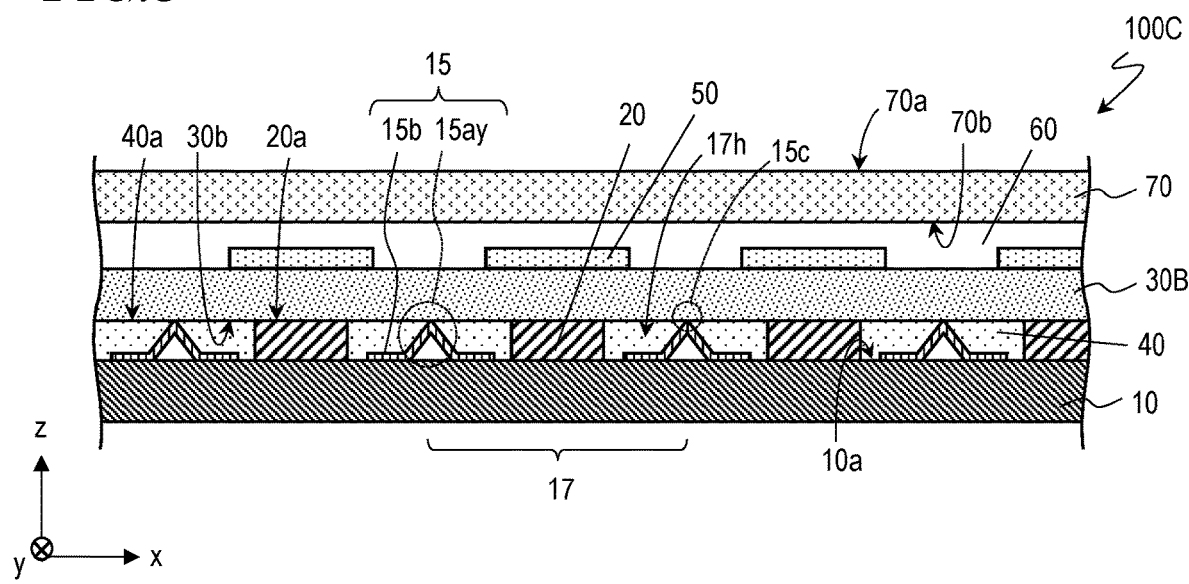
FIG. 8 is a schematic cross-sectional view of a light emitting device according to another embodiment of the present disclosure.

FIG. 8 schematically shows a cross section of a light emitting device 100C according to another embodiment of the present disclosure. As compared to the light emitting device 100B which has been described with reference to FIG. 7, the light emitting device 100C shown in FIG. 8 further includes a partitioning member 15 that is located between the mounting board 10 and the wavelength conversion layer 30B. Hereinafter, details of the partitioning member 15 will be described.

Partitioning Member 15

The partitioning member 15 includes bottoms 15b, and walls 15ay extending along the y direction. As shown in FIG. 8, each wall 15ay is located between two adjacent light sources 20 along the x direction. Although not shown in FIG. 8, between two adjacent light sources 20 along the y direction, the partitioning member 15 includes walls (i.e., walls 15ax shown in FIG. 10 as described below) extending along the x direction. A bottom 15b, two walls 15ay opposing each other along the x direction, and two walls 15ax (not shown in FIG. 8) facing each other along the y direction together create an emission space 17 defining an opening 17h. In the construction illustrated in FIG. 8, each light source 20 is located within an emission space 17. Above the light sources 20, a wavelength conversion layer 30B is disposed in such a manner as to cover over the openings 17h of the emission spaces 17.

Figure 9:
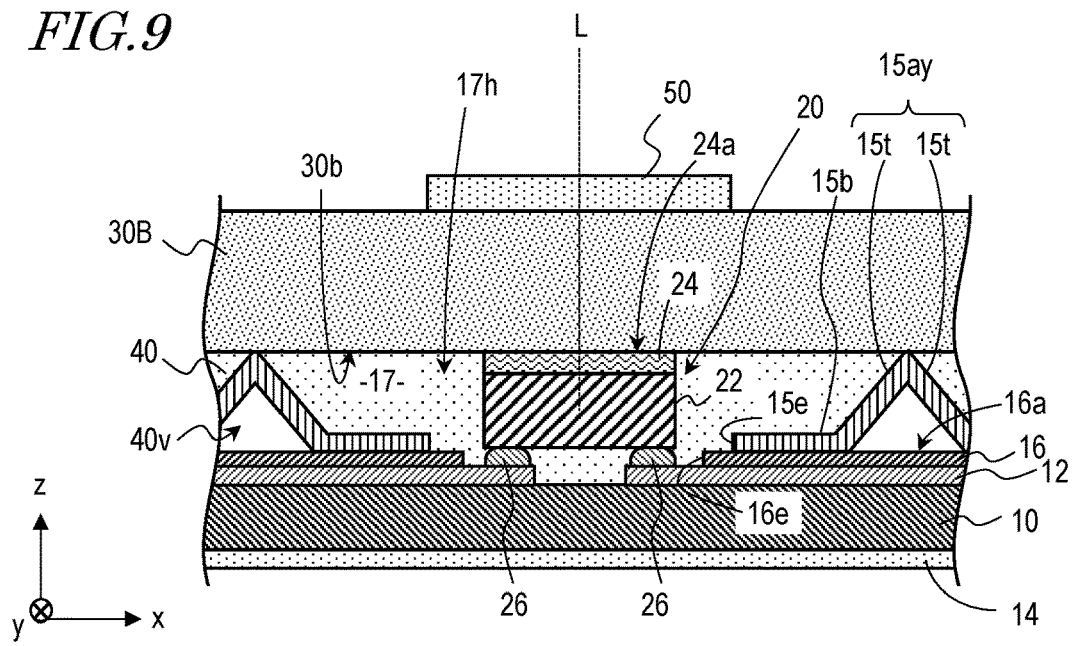
FIG. 9 is a schematic cross-sectional view schematically showing an enlargement of one of emission spaces 17 shown in FIG. 8 and a vicinity thereof.

FIG. 9 schematically shows, enlarged, one of the emission spaces 17 shown in FIG. 8 and vicinity thereof. Each wall 15ay extending along the y direction includes a pair of slopes lot extending along the y direction. As shown in FIG. 9, the pair of slopes Mt face the opening 17h of the emission space 17 in a zx cross section. Each wall 15ay has an apex 15c, such that, in this example, the apex 15c of the wall 15ay is in contact with the lower face 30b of the wavelength conversion layer 30B. Similarly, each wall 15ax (not shown in FIG. 8) extending along the x direction also includes a pair of slopes 15s extending along the x direction, the pair of slopes 15s facing the opening 17h of the emission space 17 in a yz cross section (not shown). Each wall 15ax (not shown) has an apex 15c similarly to each wall 15ay, such that, in this example, the apex 15c of wall 15ax is in contact with the lower face 30b of the wavelength conversion layer 30B. It is not essential for the apices 15c of the walls May or the apices 15c of the walls 15ax to be in contact with the wavelength conversion layer. However, when the apices 15c of the walls 15ay and the walls 15ax are in contact with the wavelength conversion layer, light output from a light source 20 within one emission space 17 is less likely to enter an adjacent emission space 17.

The partitioning member 15 is composed of, for example, a resin containing a reflective material or the like, thus being light-reflective. With the slopes 15s of the walls 15ax and the slopes 15t of the walls 15ay, the partitioning member 15 causes light outgoing from the light sources 20 to be reflected toward the openings 17h of the emission spaces 17. Moreover, light which is incident on the bottoms 15b is also reflected toward the openings 17h of the emission spaces 17. By providing the partitioning member 15 surrounding each of the plurality of light sources 20 on the mounting board 10, light outgoing from the light sources 20 is allowed to efficiently enter the wavelength conversion layer (which herein is the wavelength conversion layer 30B), whereby the luminance on the upper face 70a of the light diffuser 70 (see, for example FIG. 8) can be improved.

As shown in FIG. 9, a throughhole 15e is made in the center of each bottom 15b, such that the light source 20 is located within this throughhole 15e. The shape and size of the throughhole 15e can be appropriately selected, so long as the shape and size allow the light source 20 to be located inside. From the standpoint of utilizing reflection at each bottom 15b of the partitioning member 15, the outer edge of the throughhole 15e may advantageously be located near the light source 20. In other words, the gap between the throughhole 15e and the light source 20 in upper plan view may advantageously be narrow in order to improve the efficiency of light utilization.

As described above, the partitioning member 15 is light-reflective. For example, the partitioning member 15 may be constructed of a resin containing a reflective material of oxide particles, for example, titanium oxide, aluminum oxide, or silicon oxide; alternatively, after molding is carried out with a resin that contains substantially no reflective material, a reflective material may be provided on the surface. The partitioning member 15 may have a reflectance of e.g. 70% or more with respect to outgoing light from the light sources 20.

The partitioning member 15 can be formed by molding using a die, or by stereolithography. Examples of molding methods using a die include injection molding, extrusion molding, compression molding, vacuum molding, compressed air forming, and press forming. For example, by applying vacuum molding to a reflective sheet which is made of PET or the like, the bottoms 15b and the walls 15ax and 15ay can be integrally formed. The reflective sheet may have a thickness of, for example, in a range of from 100 μm to 500 μm.

In this example, an insulating member 16 is provided on the conductor wiring layer 12, such that the lower faces of the bottoms 15b of the partitioning member 15 are fixed on an upper face 16a of the insulating member 16. The portions that are surrounded by the insulating member 16 and the two slopes 15t of the walls 15ay (or the two slopes 15s of the walls 15ax) may be hollow, or filled with resin or the like. For example, the portions that are surrounded by the insulating member 16 and the two slopes 15t of the walls 15ay may be filled with a material for composing the partitioning member 15.

Figure 10:
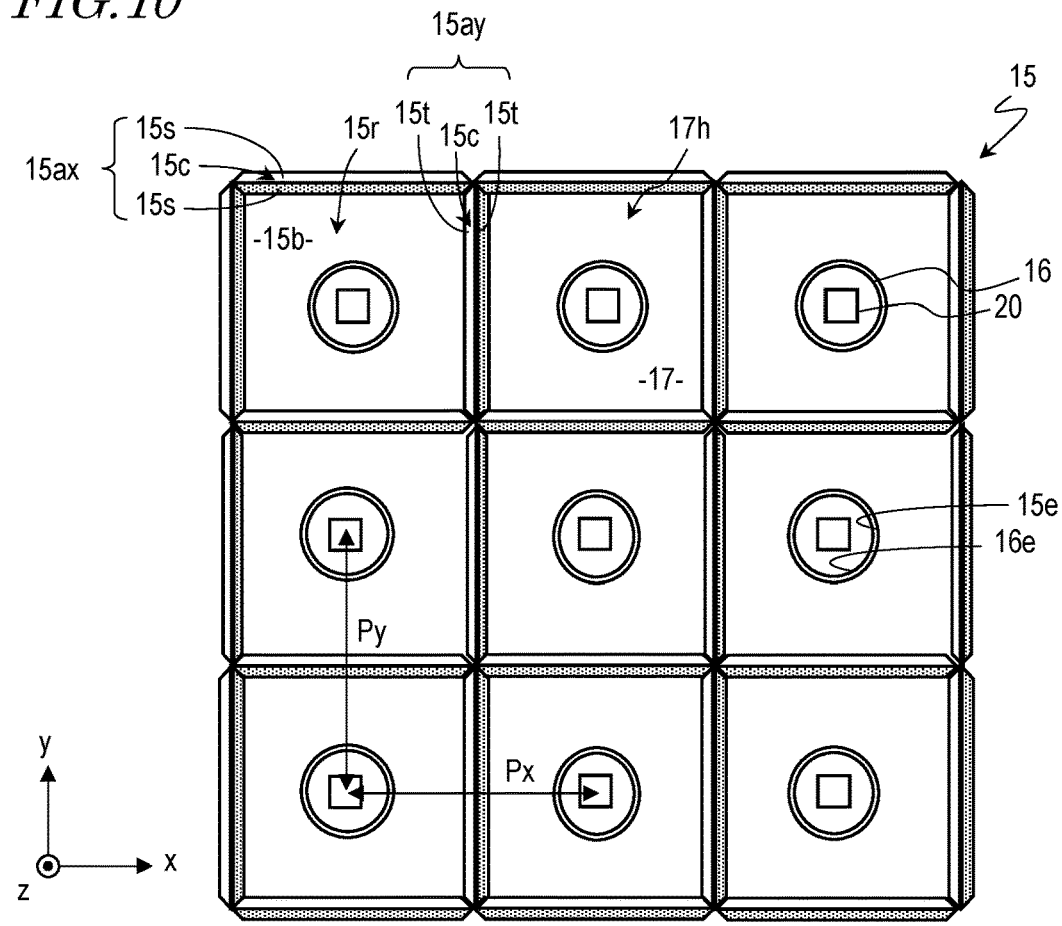
FIG. 10 is an upper plan view showing a partitioning member 15 and light sources 20, as viewed along the z direction.

FIG. 10 is a top view showing the partitioning member 15 and the light sources 20, as viewed along the z direction. FIG. 10 illustrate nine emission spaces 17 in an array of 3 rows and 3 columns. As shown therein, each light source 20 is surrounded by two walls 15ax extending along the x direction and two walls 15ay extending along the y direction. In this example, the array pitches Px of the light sources 20 along the x direction are equal to array pitches Py of the light sources 20 along the y direction. Therefore, herein, the outer shape of each bottom 15b is a square.

As described above, each wall 15ax includes the pair of slopes 15s extending along the x direction, and each wall 15ay includes the pair of slopes 15t extending along the y direction. Each pair of slopes 15s is connected at one of each slope's two sides extending along the x direction in order to constitute an apex 15c. The other of each slope's two sides extending along the x direction is connected to the bottom 15b. Similarly, each pair of slopes 15t is connected at one of each slope's two sides extending along the y direction in order to constitute an apex 15c. The other of each slope's two sides extending along the y direction is connected to the bottom 15b. The bottom 15b is located in a region 15r that is surrounded by two walls 15ax and two walls 15ay.

Each emission space 17 as partitioned by the partitioning member 15 defines the smallest unit of the light emission region when the plurality of light sources 20 are driven each independently. Therefore, in the case where the plurality of light sources 20 are driven independently, each emission space 17 defines the smallest unit of local dimming, as the light emitting device 100C (as a surface light emitting device) is viewed from the upper face 70a of the light diffuser 70. Driving the plurality of light sources 20 each independently can realize light emitting device capable of being driven to achieve local dimming by the smaller unit. Alternatively, adjacent ones of the plurality of light sources 20 may be simultaneously driven with synchronized ON/OFF timing, whereby local dimming driving can be achieved by larger units.

Insulating Member 16

As described above, in this example, the insulating member 16 is present between the partitioning member 15 and the conductor wiring layer 12. The insulating member 16 defines throughholes 16e such that the light source 20 in each region 15r is located within the throughhole 16e, as shown in FIG. 10.

FIG. 9 is referred to again. The insulating member 16 covers regions of the conductor wiring layer 12 other than the regions that are electrically connected to the light sources 20 and other electrical members, etc. The insulating member 16 functions as a resist to impart electrical insulation to regions of the conductor wiring layer 12 where no light sources 20 or other electrical members, etc., are disposed.

For example, the insulating member 16 can be formed by using a resin material, for example, an epoxy resin, a urethane resin, an acrylic resin, a polycarbonate resin, a polyimide resin, an oxetane resin, a silicone resin, or a modified silicone resin. The insulating member 16 may be constructed of a material which is a resin contains a reflective material of oxide particles, for example, titanium oxide, aluminum oxide, or silicon oxide, dispersed therein. By using such a material to provide light-reflective insulating member 16 on the conductor wiring layer 12, light from the light sources 20 can be reflected at the upper face 10a of the mounting board 10 side, and thus leakage and absorption of light at the mounting board 10 side can be inhibited or prevented, resulting in improved light extraction efficiency of the light emitting device 100C. Reflectance of the insulating member 16 with respect to outgoing light from the light sources 20 may be, for example, 70% or more.

From the standpoint of obtaining an enhanced efficiency of light utilization by allowing light which is incident on the insulating member 16 having light-reflectivity to be reflected to above each light source 20, the gap between the outer edge of the throughhole 16e and the light source 20 may advantageously be narrow, in upper plan view. However, if the gap between the outer edge of the throughhole 16e and the light source 20 is decreased, the light to be reflected toward immediately above the light source 20 will have an increased proportion, thus promoting luminance non-uniformity. In the embodiments of the present disclosure, scatter reflection portions 50, each located above at least a portion of the upper face of a light source 20, are provided on the wavelength conversion layer (which herein is the wavelength conversion layer 30B). This allows the light immediately above the light source 20 and the vicinity thereof to undergo scatter reflection by the scatter reflection portions 50. As a result, even if the gap between the throughhole 16e and the light source 20 is decreased, luminance immediately above the light source 20 can be reduced, thereby inhibiting luminance non-uniformity.

On the upper faces 16a of the insulating members 16, the partitioning member 15 is fixed with an adhesive member, for example. The adhesive member may be a double sided tape, a hot-melt adhesive sheet, or an adhesive solution of thermosetting resin or thermoplastic resin. The adhesive member may advantageously be highly non-flammable. By providing the adhesive member around each throughhole 15e, outgoing light from the light source 20 can be inhibited from entering between the insulating member 16 and the partitioning member 15. For example, an adhesive member may be provided in an annular shape along the outer edge of the throughhole 15e. Without being limited to fixation based on an adhesive member, the partitioning member 15 may be fixed to the insulating member 16 with any other fastening member, e.g., screws, pins, or the like.

In this example, the emission spaces 17 defined by the walls 15ay and 15ax are filled with the material of the protection layer 40. The partitioning member 15 may be fixed onto the upper face 16a of the insulating member 16, and then a material of the protection layer 40 may be introduced from the partitioning member 15 side, thereafter the material of the protection layer 40 is allowed to cure. The cured material may be ground down to the positions of the apices 15c of the walls 15ay and 15ax. Accordingly the protection layer 40 covering the lateral faces of the light sources 20 can be formed. Subsequently, the wavelength conversion layer 30B and the scatter reflection portions 50 may be sequentially formed on the protection layer 40. Alternatively, the scatter reflection portion 50 may be disposed on one of the principal faces of a sheet, and the sheet may be disposed on the protection layer 40 in which wavelength converting material is dispersed. Accordingly, a structure as shown in FIG. 9 is obtained.

Figure 11:
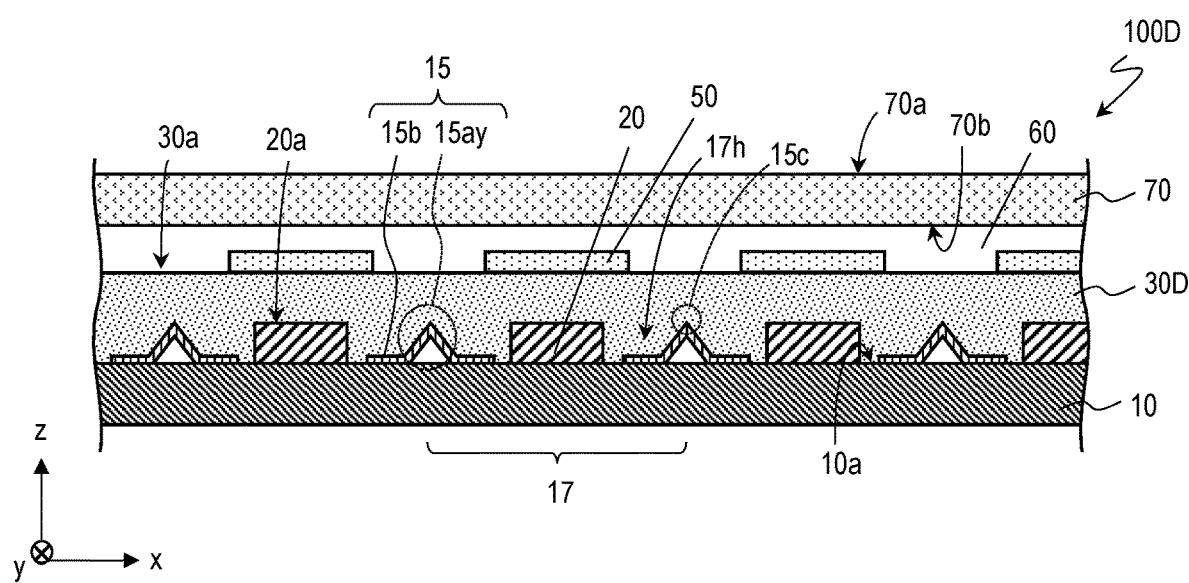
FIG. 11 is a schematic cross-sectional view of a light emitting device according to still another embodiment of the present disclosure.

Alternatively, the emission spaces 17 may be filled with a resin material in which wavelength converting material is dispersed. A light emitting device 100D shown in FIG. 11 is similar to the light emitting device 100A shown in with reference to FIG. 1 in that a wavelength conversion layer 30D provided with scatter reflection portions 50 which is disposed on an upper face 30a thereof, covers over the plurality of light sources 20. However, the light emitting device 100D includes a partitioning member 15 which is embedded within the wavelength conversion layer 30D. With such a construction also, luminance at the upper face 70a of the light diffuser 70 can be improved. The distance from the upper face 10a of the mounting board 10 to each apex 15c (i.e., the height of each apex 15c) may be adjusted as appropriate, depending on the distance H from the upper face 10a of the mounting board 10 to each scatter reflection portion 50 or the like. The apices 15c may be exposed on the wavelength conversion layer 30D.

A light emitting device according to an embodiment of the present disclosure can be utilized as a surface light emitting device which is capable of local dimming control, and may suitably be used as, for example, a backlight of a liquid crystal display device, a light source for various lighting devices, a light source for vehicle component. A light emitting device according to an embodiment of the present disclosure is able to inhibit luminance non-uniformity while attaining a reduced thickness, and therefore is particularly advantageously applicable to a backlight of a display device of a mobile device that faces a stringent demand for reduced thickness.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
   a mounting board;
   a plurality of light sources arranged on the mounting board;
   a light diffuser arranged above the plurality of light sources;
   a plurality of scatter reflection portions each being arranged above at least a portion of an upper face of a corresponding one of the light sources, each of the scatter reflection portions containing particles of reflective material, and each of the scatter reflection portions having a single-layered or multi-layered structure in a cross-sectional view;
   a partitioning member that is light-reflective, the partitioning member including walls defining each of a plurality of regions and surrounding each of the light sources on the mounting board, with each of the walls having an apex in a cross section; and a wavelength conversion member located at least between the light sources and the light diffuser, the wavelength conversion member being configured to absorb at least a portion of light from the light sources and to emit light having a wavelength which is different from a wavelength of the light from the light sources, wherein the apex of each of the walls is in contact with a lower face of the wavelength conversion member, the walls of the partitioning member defining each of the plurality of regions include a first wall and a second wall, the first wall and the second wall extending along a first direction, and the first wall and the second wall opposing each other along a second direction which is different from the first direction, each of the plurality of light sources include a first light source located between the first wall and the second wall defining the corresponding one of the plurality of regions, the first light source having a first width along the second direction, and in a cross section of each of the plurality of regions along the second direction, the scatter reflection portion that is arranged above the first light source has a second width which is greater than the first width, the second width being smaller than a distance between the apex of the first wall and the apex of the second wall.

2. The light emitting device of claim 1, wherein the wavelength conversion member covers lateral faces of each of the light sources.

3. The light emitting device of claim 1, further comprising a protection layer covering at least lateral faces of each of the light sources.

4. The light emitting device of claim 1, further comprising a conductor wiring layer which includes a plurality of interconnection patterns each connected to one or more of the light sources.

5. The light emitting device of claim 1, wherein an array pitch between adjacent ones of the light sources is not less than 0.1 mm but less than 5 mm.

6. The light emitting device of claim 1, wherein a distance from a surface of the mounting board, on which the light sources are arranged, to each of the scatter reflection portions is 1.5 mm or less.

7. The light emitting device of claim 1, wherein a ratio of a distance from a surface of the mounting board, on which the light sources are arranged, to each of the scatter reflection portions with respect to an array pitch between adjacent ones of the light sources is not less than 0.1 and not more than 0.5.

8. The light emitting device of claim 1, wherein each of the light sources has the upper face on which a light reflecting layer is disposed.

9. The light emitting device of claim 1, wherein the plurality of scatter reflection portions are arranged on a surface of the wavelength conversion member that is closer to the light diffuser.

10. The light emitting device of claim 9, wherein each of the scatter reflection portions includes
a first region arranged immediately above the corresponding one of the light sources, and
a second region surrounding the first region in a plan view,
with a density of the particles of the reflective material in the second region being smaller than a density of the particles of the reflective material in the first region.

11. The light emitting device of claim 10, wherein each of the plurality of scatter reflection portions includes
a first layer arranged on the surface of the wavelength conversion member continuously in the first region and in the second region in the plan view, and a second layer arranged on the first layer in the first region in the plan view.

12. The light emitting device of claim 10, wherein a size of the first region is equal to or larger than a size of the light source in the plan view.

13. The light emitting device of claim 9, further comprising
a light-transmitting layer arranged between the wavelength conversion member and the light diffuser and covering the plurality of scatter reflection portions, the light-transmitting layer having a flat upper surface.

14. The light emitting device of claim 1, wherein the wavelength conversion member is spaced apart from the mounting board.

15. The light emitting device of claim 1, wherein a shape of each of the plurality of scatter reflection portions is a circle which is centered around an optical axis of the corresponding one of the light sources.

16. The light emitting device of claim 1, wherein each of the light sources includes a light-emitting element including a nitride semiconductor.

17. The light emitting device of claim 1, wherein the mounting board includes a metal layer arranged on a lower face opposite to an upper face on which the plurality of light sources are arranged.

18. The light emitting device of claim 1, further comprising
a protection layer covering at least lateral faces of each of the light sources.

19. The light emitting device of claim 18, wherein the wavelength conversion member is arranged on or above the protection layer.

20. The light emitting device of claim 1, wherein the partitioning member further includes planar bottoms each extending, in parallel with a surface of the mounting board, from bottom parts of the walls toward a corresponding one of the light sources.

* * * * *